US010071551B2

(12) United States Patent
De Groot et al.

(10) Patent No.: US 10,071,551 B2
(45) Date of Patent: Sep. 11, 2018

(54) PRINT HEAD ASSEMBLY

(71) Applicant: Océ-Technologies B.V., Venlo (NL)

(72) Inventors: Wesley A. De Groot, Venlo (NL); Adrianus A. Draad, Venlo (NL)

(73) Assignee: OCE-TECHNOLOGIES B.V., Venlo (NL)

( * ) Notice: Subject to any disclaimer, the term of this patent is extended or adjusted under 35 U.S.C. 154(b) by 0 days.

(21) Appl. No.: 15/638,833

(22) Filed: Jun. 30, 2017

(65) Prior Publication Data

US 2017/0297330 A1 Oct. 19, 2017

Related U.S. Application Data

(63) Continuation of application No. PCT/EP2016/050056, filed on Jan. 5, 2016.

(30) Foreign Application Priority Data

Jan. 7, 2015 (EP) .................................... 15150243

(51) Int. Cl.

| | |
|---|---|
| ***B41J 2/14*** | (2006.01) |
| ***B41J 29/377*** | (2006.01) |
| ***B41J 2/175*** | (2006.01) |
| ***B41J 29/02*** | (2006.01) |
| ***B41J 2/15*** | (2006.01) |

(52) U.S. Cl.

CPC ......... *B41J 2/1408* (2013.01); *B41J 2/14072* (2013.01); *B41J 2/15* (2013.01); *B41J 2/175* (2013.01); *B41J 29/02* (2013.01); *B41J 29/377* (2013.01); *B41J 2002/14362* (2013.01); *B41J 2202/08* (2013.01); *B41J 2202/14* (2013.01);

(Continued)

(58) Field of Classification Search

CPC ...... B41J 2/1408; B41J 2/14072; B41J 2/175; B41J 29/02; B41J 2202/14; B41J 2202/19; B41J 2002/14362

See application file for complete search history.

(56) References Cited

U.S. PATENT DOCUMENTS

| | | | |
|---|---|---|---|
| 4,819,011 | A | 4/1989 | Yokota |
| 4,968,160 | A | 11/1990 | Ishizuka |

(Continued)

FOREIGN PATENT DOCUMENTS

| | | | |
|---|---|---|---|
| EP | 0 411 462 | A1 | 2/1991 |
| JP | 60-49986 | A | 3/1985 |
| JP | 2014-65314 | A | 4/2014 |

OTHER PUBLICATIONS

International Search Report for PCT/EP2016/050056 (PCT/ISA/210) dated Jun. 1, 2016.

(Continued)

*Primary Examiner* — Geoffrey Mruk

(74) *Attorney, Agent, or Firm* — Birch, Stewart, Kolasch & Birch, LLP

(57) ABSTRACT

A print head assembly including a print head unit, a cooling duct, and a blower arranged to pass a gaseous cooling medium through the cooling duct. The cooling duct has an elongated closed hollow cross-section bounded on at least one side by a flat wall. The print head unit is attached to the flat wall outside of the cooling duct such that the print head unit is cooled by the gaseous medium passing through the cooling duct via thermal contact through the flat wall of the cooling duct.

14 Claims, 5 Drawing Sheets

(52) U.S. Cl.
CPC ......... *B41J 2202/19* (2013.01); *H05K 999/99* (2013.01)

(56) References Cited

U.S. PATENT DOCUMENTS

| | | | | | |
|---|---|---|---|---|---|
| 5,374,944 | A * | 12/1994 | Janosky | B41J 29/377 | |
| | | | | 347/223 | |
| 5,751,327 | A | 5/1998 | De Cock et al. | | |
| 6,113,212 | A * | 9/2000 | Ng | B41J 29/377 | |
| | | | | 347/18 | |
| 7,429,098 | B2 * | 9/2008 | Murakami | B41J 2/175 | |
| | | | | 347/54 | |
| 2002/0057312 | A1 | 5/2002 | Watanabe et al. | | |
| 2009/0066745 | A1 | 3/2009 | Ueda | | |
| 2009/0085950 | A1 | 4/2009 | Takata | | |
| 2012/0257918 | A1 | 10/2012 | Perry et al. | | |

OTHER PUBLICATIONS

Written Opinion of the International Searching Authority for PCT/EP2016/050056 (PCT/ISA/237) dated Jun. 1, 2016.

* cited by examiner

PRINT HEAD ASSEMBLY

CROSS REFERENCE TO RELATED APPLICATIONS

This application is a Continuation of PCT International Application No. PCT/EP2016/050056, filed on Jan. 5, 2016, which claims priority under 35 U.S.C. 119(a) to patent application Ser. No. 15/150,243.2, filed in Europe on Jan. 7, 2015, all of which are hereby expressly incorporated by reference into the present application.

The invention relates to a print head assembly comprising a print head unit; a cooling duct; and a blower arranged to pass a gaseous cooling medium through the cooling duct.

US 2012257918 A1 describes a print head assembly, wherein a print head unit is in thermal contact with a heat sink and the print head unit and the heat sink are arranged inside of the cooling duct so that heat that is generated by the print head and/or its controller will be dissipated by the current of the cooling medium flowing past the print head unit and the heat sink.

EP 0411462 A1 discloses a thermal inkjet print head unit arranged on a heat sink, wherein the heat sink and print head unit are arranged at an open end of a cooling duct. At another open end of the cooling duct, a blower is arranged such to draw air through the cooling duct, thereby cooling the heat sink and the print head unit. Still an air flow is generated around the print head unit, which may negatively impact droplet positioning. Further, a relatively complex arrangement is needed.

It is an object of the invention to provide a print head assembly that has a more efficient, simple and compact cooling system.

According to the invention, the cooling duct has an elongated closed hollow cross-section bounded on at least one side by a flat wall, and the print head unit is attached to the flat wall outside of the cooling duct.

As the print head unit, which may have a relatively complicated shape, is not disposed inside the cooling duct or at an open end of the cooling duct, the cooling medium can be guided through the duct in a smooth manner and with reduced pressure loss, so that the capacity, size and power consumption of the blower can be reduced and the noise generated by the current of the cooling medium (air) will also be reduced. The print head unit is cooled by the gaseous cooling medium passing through the cooling duct via thermal contact through the flat wall of the cooling duct. In particular, the elongated cross-section of the cooling duct forces the cooling medium to flow closely past the flat wall that provides a large heat-exchanging surface with the print head unit, thereby assuring an efficient heat transfer from the print head unit to the cooling medium. Moreover, as the print head unit is attached to the flat wall of the cooling duct, the cooling duct may form at least a part of a mounting structure for mounting the print head unit in a frame or a reciprocating carriage of a printer.

In the latter case, when the print head unit is mounted on a reciprocating carriage, it is convenient that the blower is also mounted on the carriage and is directly connected to the cooling duct. Then, the reduced weight of the blower reduces the mass that has to be accelerated and decelerated in the course of the reciprocating movement of the carriage. Moreover, since the hollow cooling duct has a relatively high rigidity, it may serve as a supporting beam supporting the print head unit against the forces of inertia.

When the print head is of a type employing a print process that is sensitive to a current of ambient air, as is the case for example with an ink jet printer where an air current may cause an aberration of the ink droplets, the invention has the further advantage that the closed ink duct helps to keep away the current of cooling medium (air) from the sensitive parts of the print head.

More specific optional features of the invention are indicated in the dependent claims.

Optionally a heat sink may be arranged inside of the cooling duct so as to be in thermal contact with the flat wall to which the print head unit is attached on the outside.

The print head unit may comprise a print head and an electronic print head controller. When the print head controller is the main source of heat in the print head unit, it will be the controller section of the print head unit that is directly attached to the flat wall of the cooling duct, whereas the print head may project from the cooling duct, preferably in a direction normal to the longitudinal direction of the duct. For example, a circuit board carrying the electronic components of the controller may be attached directly to the flat wall of the cooling duct.

In a preferred embodiment, the entire support structure for the print head unit or at least for the controller section thereof is formed by the cooling duct that projects beyond the print head unit with both its ends, so that these projecting ends can be used for stably mounting the assembly of the cooling duct and the print head unit in the frame or carriage. Since at least one end of the cooling duct has to be connected to the blower, it is convenient to use a movable clamp that has the two-fold function of securing one end of the cooling duct to the carriages and of establishing a fluid connection between the cooling duct and the blower. At the opposite end, a clamp that is used for mechanically connecting the duct to the carriage may be configured as a diffuser for smoothly drawing-in ambient air, when the blower is a suction blower, and smoothly discharging air, respectively, when the blower is arranged to supply air as cooling medium into the cooling duct.

In general, the print head has to be positioned with high accuracy relative to the frame and, therewith, relative to a recording medium that is moved through the printer. Then, it may be convenient that the print head, although it forms a unit with the controller, is movably attached to the controller, so that the print head and the controller may be positioned independently of one another.

In a high performance printer, the print head assembly may comprise a plurality of print head units arranged adjacent to one another, each of the print heads having its own controller. Then, it is preferred that a separate cooling duct is provided for each of the controllers, and the print head units are arranged such that the cooling ducts extend in parallel to one another. The blower may then be connected to a plenum chamber that connects to the open ends of all the cooling ducts on one side of the assembly.

An embodiment example will now be described in conjunction with the drawings, wherein.

Figure 1:
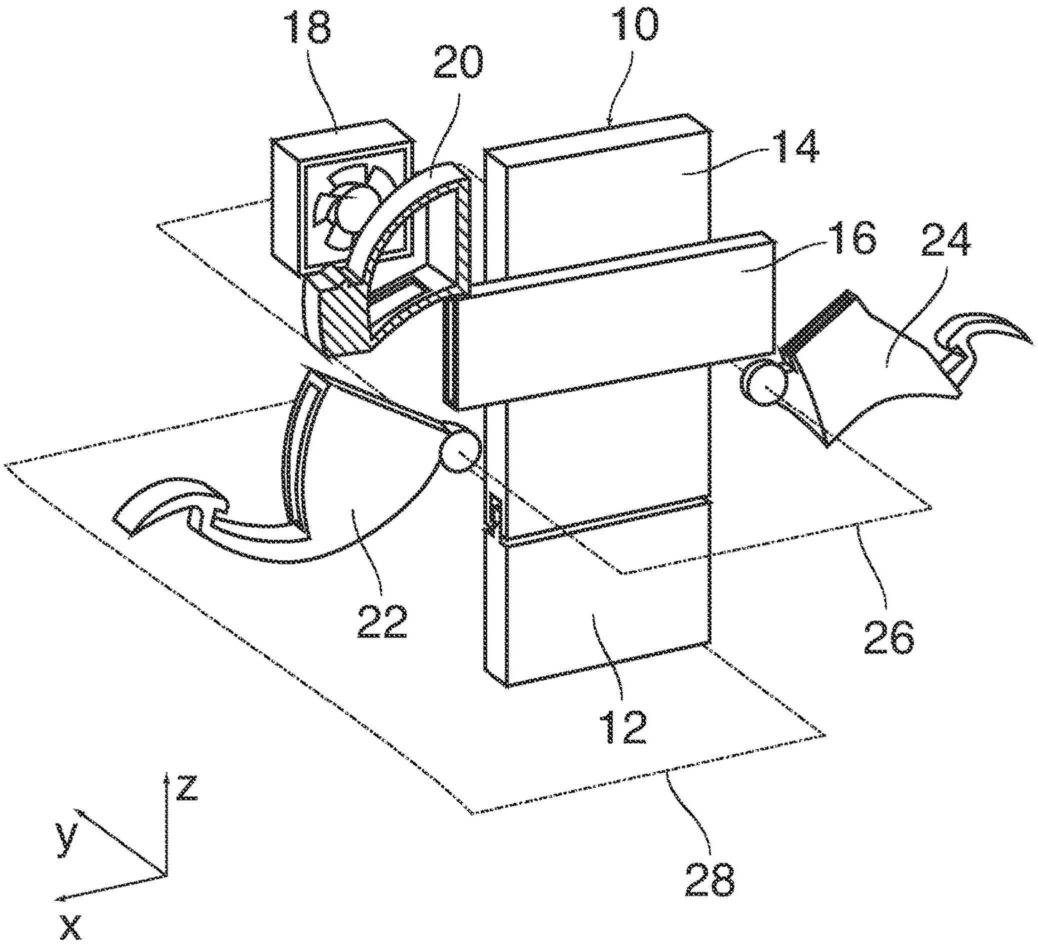
FIG. 1 is an exploded perspective view showing essential parts of a print head assembly according to the invention.

As is shown in FIG. 1, a print head assembly comprises a print head unit 10 formed of a print head 12 and a print head controller 14. The assembly further comprises a cooling duct 16 to which the print head controller 14 is attached, a suction blower 18 and a plenum chamber 20 of which only a slice has been shown in FIG. 1 and which is arranged to connect the blower 18 to one end of the cooling duct 16.

An exit side clamp 22 and an entry side clamp 24 are pivotally mounted on a frame 26 (shown only in phantom lines in FIG. 1) and can be pivoted into respective positions in which they straddle the opposite ends of the cooling duct 16 so as to secure the cooling duct and the print head unit 10 on the frame 26. The exit side clamp 22 has the additional function of establishing fluid communication between one end of the cooling duct 16 and the plenum chamber 20.

In this example, it shall be assumed that the print head 12 is an ink jet print head having, in a bottom end face that is not visible in FIG. 1, a row of nozzles that extends in a direction x, whereas the frame 26 forms part of a reciprocating carriage that travels in a direction y normal to the direction x. The nozzles of the print head 10 are facing a sheet 28 of a recording medium (shown in phantom lines in FIG. 1) that is advanced step-wise in the direction x.

The print head 12 and the controller 14 are disposed adjacent to one another in a direction z normal to the x-y-plane. The print head 12 and the controller 14 are snap-fastened together so that, on the one hand, they can be handled as a single unit (the print head unit 10 together with the cooling duct 16), but on the other hand are movable relative to one another within a limited range. This permits to precisely adjust the print head 12 relative to the path of the recording medium 28 by means of an adjusting mechanism that has not been shown here, the adjustment being independent of the position of the controller 14 that is determined by the clamps 22, 24 holding the cooling duct 16.

Figure 2:
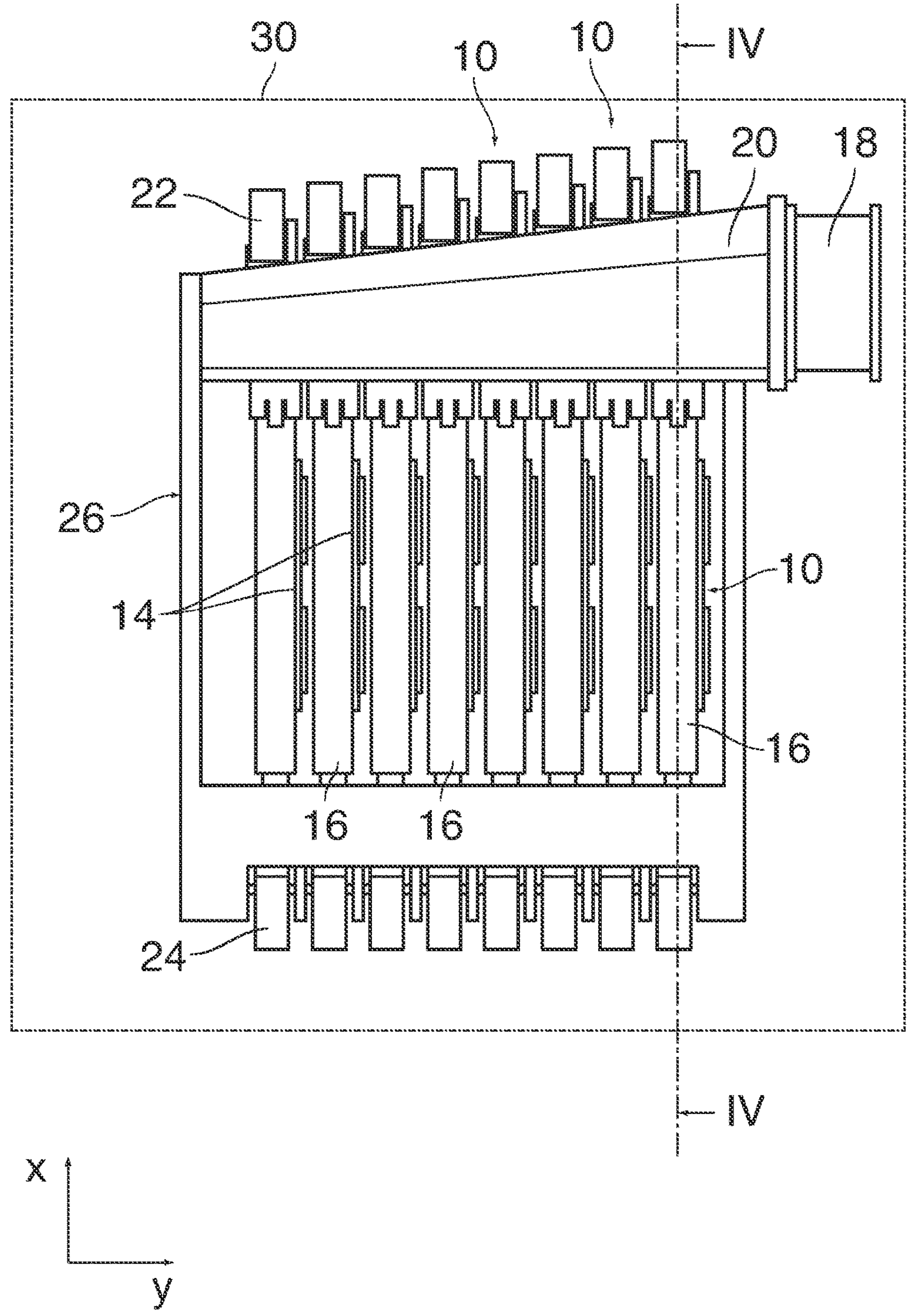
FIG. 2 is a top plan view of a print head assembly comprising a plurality of print head units.

FIG. 2 is a top plan view of the frame 26 as mounted on a reciprocating carriage 30 (shown in phantom lines only). The frame 26 accommodates a plurality of print head units 10, e.g. for different colours. Each print head unit 10 has its own cooling duct 16 and its own clamps 22, 24 arranged in the basic configuration as shown in FIG. 1, whereas the blower 18 and the plenum chamber 20 are common to all print head units.

The plenum chamber 20 interconnects the exit side clamps 22 of all units when these clamps are connected to the open end of the associated cooling ducts 16. The plenum chamber is tapered towards the end facing away from the blower 18 so as to create an essentially uniform suction pressure at the end of each cooling duct 16.

Figure 3:
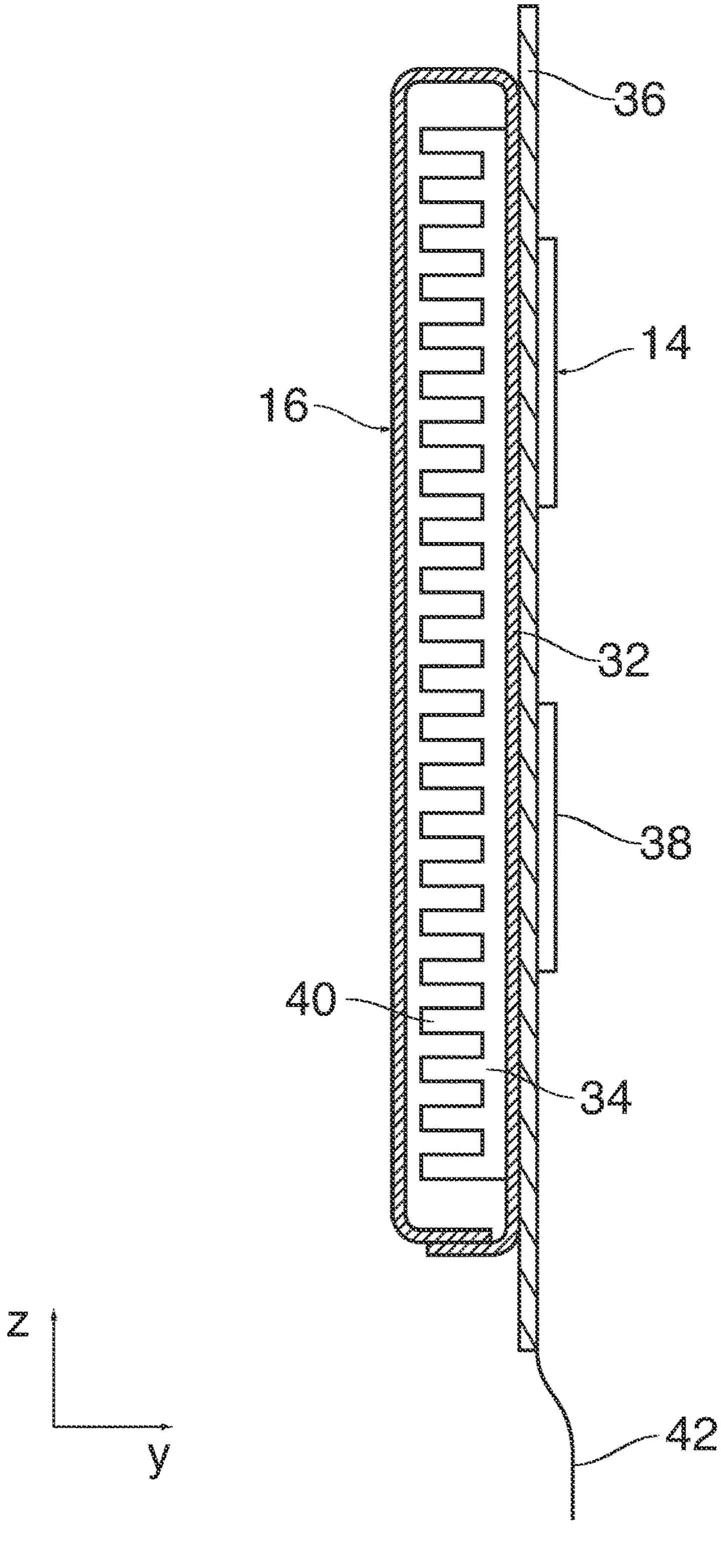
FIG. 3 is a cross-sectional view of a cooling duct with a print head unit attached thereto.

As is shown in FIG. 3, each cooling duct 16 has an elongated rectangular cross-section and is formed of a single piece of sheet metal that has been folded back onto itself so as to fully enclose the internal space of the cooling duct. The controller 14 is attached to a flat wall 32 that forms one of the longer walls of the elongated cross-section of the cooling duct. A heat sink 34 is disposed inside of the cooling duct and is attached to the same wall 32. As is well known in the art, the controller 14 may comprise a circuit board 36 with electronic components 38 (e.g. integrated circuit chips) mounted thereon. In known circuit board designs having a heat sink, the electronic components are arranged such that a good thermal contact between the electronic components and the heat sink is established. The same arrangement is used here for establishing a good thermal contact between the electronic components 38 and the wall 32 which has a high thermal conductivity, so that the heat will be readily passed on to the heat sink 34 inside the duct.

The heat sink 34 has fins 40 that extend in longitudinal direction of the duct 16 so as to minimize the resistance opposing the flow of the cooling medium (air) though the duct.

FIG. 3 further shows a portion of a flexible connector strip 42 that has a plurality of leads connecting the controller 14 to the print head 12.

Figure 4:
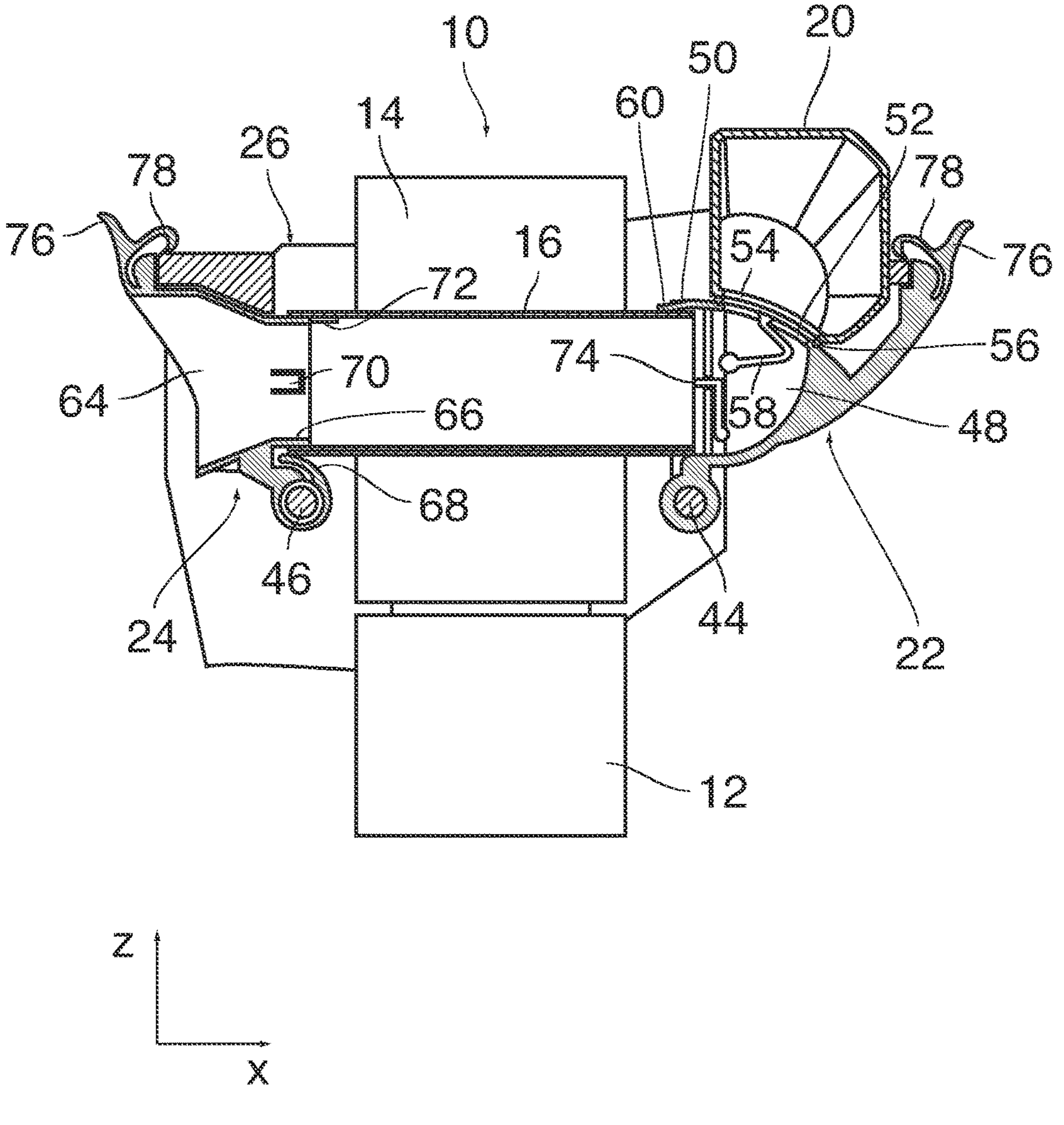
FIG. 4 is a cross-sectional view taken along the line IV-IV in FIG. 2.
Figure 5:
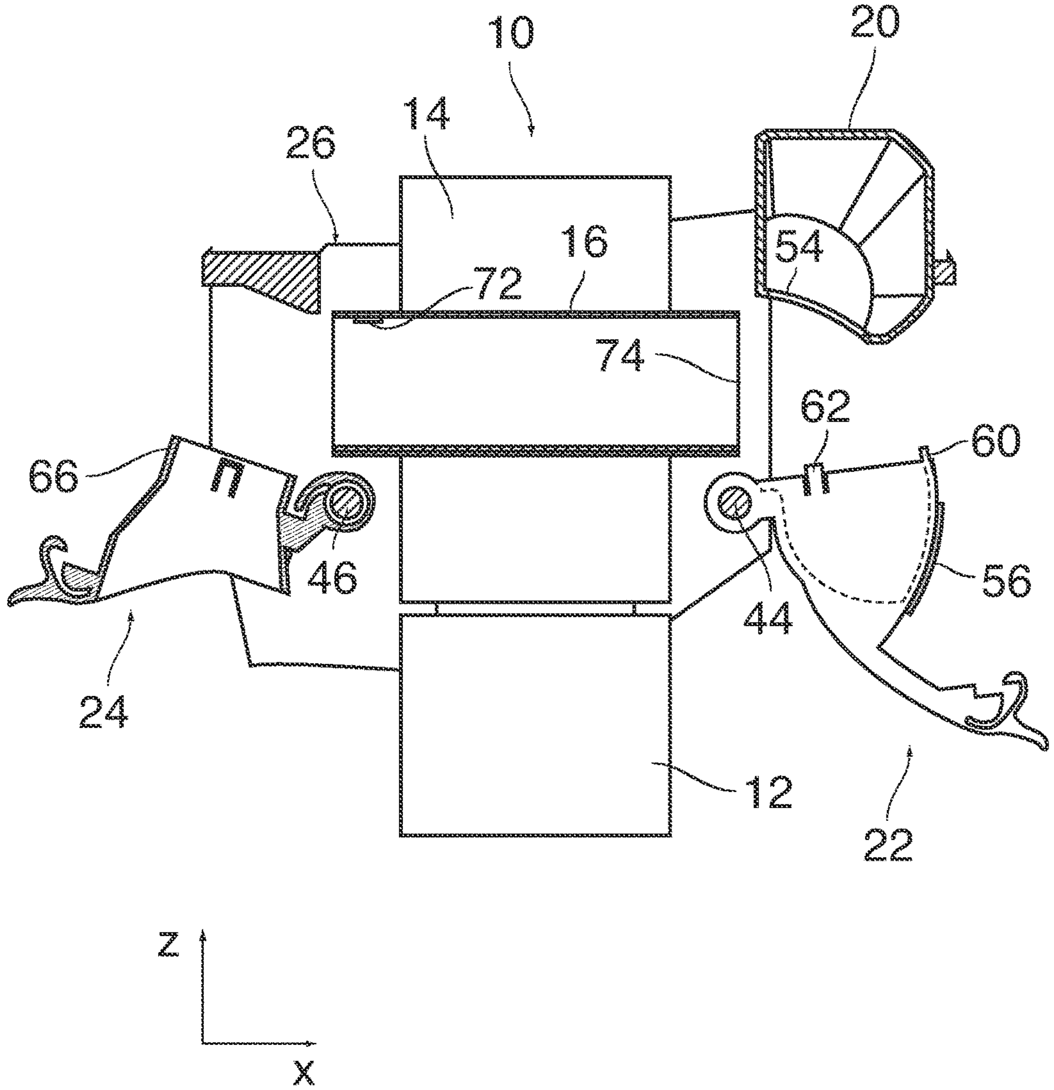
FIG. 5 is a sectional view corresponding to the one in FIG. 4, but showing the assembly in a condition in which the print head unit can be removed.

As can be seen in FIG. 4, the frame 26 has two parallel axles 44 and 46 on which the clamps 22 and 24 are pivotally supported. FIG. 4 shows the condition in which the duct 16 is held by the clamps, whereas FIG. 5 shows a condition in which the clamps have been pivoted away so that they release the ends of the duct 16 which can then be removed from the frame 26 together with the print head unit 10.

The exit side clamp 22 forms a cavity 48 with a mouth 50 that fits over and completely surrounds the end of the duct 16. An opening 52 in a top wall of the cavity 48 is aligned with a window 54 of the plenum chamber 20. The gap between the clamp 22 and the plenum chamber 20 is sealed with a seal 56 that surrounds the opening 52 and the window 54 and is elastically supported on the clamp 22 with a spring 58. Thus, when the clamp 22 is pivoted into the position shown in FIG. 5, the seal 56 is still held in position, and when the clamp 22 is pivoted back into the position shown in FIG. 4, the seal will smoothly slide onto the bottom wall of the plenum chamber 20 until it reaches again the position shown in FIG. 4.

A leaf spring 60 is formed in the top wall of the mouth 50 and arranged to press the end of the duct 16 downward against the bottom wall of the mouth. Another leaf spring 62 that is visible only in FIG. 5 is formed in one of the side walls of the cavity 48 and arranged near the bottom of the mouth 50 so as to urge the end of the duct in the direction y. In a position opposing the end of the leaf spring 62, a cylindrical boss (not shown) may be formed in the outer side wall of the duct 16, and this boss will be urged against the internal wall of the mouth 50, thereby to determine the exact position of the end of the duct 16 in the direction y.

The entry side clamp 24 forms a funnel 64 with a mouth 66 that fits into the internal cross section of the corresponding end of the duct 16. Ambient air that is sucked-in by the blower will be smoothly introduced into the duct 16 through the funnel 64 without creating a disturbing air current in the vicinity of the nozzles of the print head 12. A spring 68 urges the bottom wall of the duct 16 upwardly against the end of the mouth 66 which thereby defines the position of this end of the duct in z-direction. A leaf spring 70 in a side wall of the funnel 64 urges the end of the duct in y-direction, so that a side wall of the duct is pressed against the side wall of the funnel 64 that is opposite to the spring 70, thereby defining the position of the end of the duct 16 in y-direction. Preferably, the side wall of the duct 16 that engages the side wall of the funnel 64 has two bosses, one in the top part and one in the bottom part, for point-like abutment at the mouth 66 of the funnel. The two bosses will also prevent the duct 16 from rotating about the x-axis. It will be noted that the bosses with which the duct 16 abuts against the clamps 22, 24 are all disposed near one of the top and bottom walls of the duct, i.e. in a region where the side walls of the duct are not easily deformed in the direction y.

Another boss 72 is formed inside the duct 16 at the top wall thereof and abuts against the top end of the mouth 66. The exit side clamp 22 has another spring 74 that engages the opposite end of the duct 16 and urges the duct in x-direction, so that the boss 72 is held in engagement with the mouth 66. In this way, the position of the duct 16 and, consequently, the position of the associated print head unit 10, is precisely defined in all six degrees of freedom.

The ends of the clamps 22 and 44 remote from the axles 44 and 46 form tabs 76 and elastic claws 78 for snap-fastening the clamps in the positions shown in FIG. 4 at respective catches of the plenum chamber 20 and the frame 26, respectively.

The frame 26 and the clamps 22, 24 mounted on the axles 44, 46 can be manufactured from plastics, for example by means of 3D-printing.

The invention claimed is:

1. A print head assembly comprising:

a cooling duct having an elongated closed hollow cross-section bounded on at least one side by a flat wall;

a print head unit attached to the flat wall outside of the cooling duct; and a blower arranged to pass a gaseous cooling medium through the cooling duct, wherein the blower is mounted on a frame and the cooling duct has opposite ends that project beyond the print head unit and are detachably secured at the frame, and wherein the print head assembly further comprises a clamp that is mounted on the frame to be movable between a release position and an engaging position in which it engages one end of the cooling duct, the clamp having a cavity that establishes fluid connection between the blower and the cooling duct when the clamp is in the engaging position.

2. The print head assembly according to claim 1, wherein a heat sink is disposed inside the cooling duct and held in thermal contact with the print head unit through the flat wall of the cooling duct.

3. The print head assembly according to claim 1, wherein the print head unit comprises a print head and an electronic print head controller, the print head being configured for expelling droplets upon receipt of an electronic drive signal and the electronic print head controller being configured to provide the electronic drive signal to the print head timed in accordance with an image to be printed.

4. The print head assembly according to claim 3, wherein the print head is disposed adjacent to the electronic print head controller in a first direction, the electronic print head controller is attached to the flat wall of the cooling duct and the cooling duct extends in a second direction normal to said first direction.

5. The print head assembly according to claim 3, wherein the print head controller is held on the frame only by being attached to the cooling duct.

6. The print head assembly according to claim 1, wherein the print head is an ink jet print head.

7. The print head assembly according to claim 1, wherein a seal is provided for sealing the clamp against a plenum chamber that is connected to the blower, and the seal is elastically supported on the clamp so as to slide along a wall of the plenum chamber when the clamp is moved into the engaging position.

8. The print head assembly according to claim 1, wherein the clamp is pivotable about an axle that forms part of the frame.

9. The print head assembly according to claim 1, comprising a second clamp that is mounted on the frame to be movable between a release position and an engaging position in which it engages a second end of the cooling duct, said second clamp forming a funnel for introducing ambient air into the cooling duct or for discharging air from the cooling duct.

10. The print head assembly according to claim 9, wherein the second clamp is pivotable about an axle that forms part of the frame.

11. The print head assembly according to claim 9, wherein each of the clamps has a mouth fitted onto or into the corresponding end of the cooling duct in the engaging position, each of the clamps further having at least one spring for holding the ends of the cooling duct in abutting engagement with the mouth in at least one of the first direction, the second direction and a third direction normal to said first and second directions.

12. The print head assembly according to claim 11, wherein the clamps are arranged to position the cooling duct relative to the frame in all six degrees of freedom.

13. The print head assembly according to claim 1, comprising a plurality of cooling ducts arranged in parallel to one another, and a plurality of print head units each of which is attached to a respective one of the cooling ducts, a first end of each of the plurality of cooling ducts being in fluid communication with the same blower.

14. The print head assembly according claim 13, wherein the blower is connected to a plenum chamber that extends at right angles to the cooling ducts and connects the respective first ends of each of the plurality of cooling ducts.

* * * * *